United States Patent
Kim et al.

(10) Patent No.: US 10,172,190 B2
(45) Date of Patent: Jan. 1, 2019

(54) LIGHT EMITTING DIODE HAVING IMPROVED CURRENT SPREADING EFFICIENCY, IMPROVED MECHANICAL RELIABILITY, OR SOME COMBINATION THEREOF

(71) Applicant: Seoul Viosys Co., Ltd., Ansan-si (KR)

(72) Inventors: Mae Yi Kim, Ansan-si (KR); Seom Geun Lee, Ansan-si (KR); Yeo Jin Yoon, Ansan-si (KR); Jin Woong Lee, Ansan-si (KR); Yong Woo Ryu, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/579,370

(22) PCT Filed: May 18, 2016

(86) PCT No.: PCT/KR2016/005236
§ 371 (c)(1),
(2) Date: Dec. 4, 2017

(87) PCT Pub. No.: WO2016/195286
PCT Pub. Date: Dec. 8, 2016

(65) Prior Publication Data
US 2018/0153007 A1    May 31, 2018

(30) Foreign Application Priority Data
Jun. 5, 2015 (KR) .................. 10-2015-0080148

(51) Int. Cl.
*H01L 33/00* (2010.01)
*H01L 27/15* (2006.01)
(Continued)

(52) U.S. Cl.
CPC ......... *H05B 33/0803* (2013.01); *H01L 33/14* (2013.01); *H01L 33/36* (2013.01)

(58) Field of Classification Search
CPC ....... H01L 33/38; H01L 33/42; H01L 33/145; H01L 33/24; H01L 2933/0016;
(Continued)

(56) References Cited

U.S. PATENT DOCUMENTS 6,573,537 B1    6/2003    Steigerwald et al.
2010/0117111 A1*  5/2010  Illek ...................... H01L 33/382
                                                   257/98
(Continued)

FOREIGN PATENT DOCUMENTS

KR    10-2010-0016531    2/2010
KR    10-2012-0037636    4/2012
KR    10-2012-0053570    5/2012

OTHER PUBLICATIONS

Written Opinion dated Aug. 10, 2016, in International Appliction No. PCT/KR2016/005236 (with English translation).
(Continued)

*Primary Examiner* — Duy T Nguyen
(74) *Attorney, Agent, or Firm* — H.C. Park & Associates, PLC

(57) ABSTRACT

A light emitting diode including a first semiconductor layer and a plurality of mesas including a second semiconductor layer and an active layer interposed between the first semiconductor layer and the second semiconductor layer, the first semiconductor layer including an exposed region between the plurality of mesas, a current blocking layer disposed on a portion of the plurality of mesas and a portion of the exposed region, a transparent electrode layer covering the second semiconductor layer and the current blocking layer, and a second electrode disposed on the current blocking layer and the transparent electrode layer and electrically
(Continued)

connected to the second semiconductor layer. The current blocking layer includes a connecting portion extending from a first mesa to a second mesa adjacent to the first mesa and a protruding portion protruding from the connecting portion and disposed on the exposed region.

32 Claims, 11 Drawing Sheets

(51) Int. Cl.
  *H05B 33/08* (2006.01)
  *H01L 33/14* (2010.01)
  *H01L 33/36* (2010.01)
(58) Field of Classification Search
  CPC .............. H01L 31/0304; H01L 33/382; H01L 33/387; H01L 33/20
  USPC .................................... 257/81, 99
  See application file for complete search history.

(56) References Cited

U.S. PATENT DOCUMENTS

| | | | |
|---|---|---|---|
| 2010/0140656 A1* | 6/2010 | Kim ..................... | H01L 33/38 257/99 |
| 2012/0161176 A1* | 6/2012 | Heo ..................... | H01L 33/46 257/98 |
| 2013/0234192 A1* | 9/2013 | Kim ..................... | H01L 33/0008 257/98 |
| 2014/0159063 A1 | 6/2014 | Odnoblyudov et al. | |
| 2014/0231852 A1* | 8/2014 | Suh, II ................. | H01L 27/15 257/98 |

OTHER PUBLICATIONS

International Search Report dated Aug. 10, 2016, in International Application No. PCT/KR2016/005236.

* cited by examiner

FIG. 14A
FIG. 14B
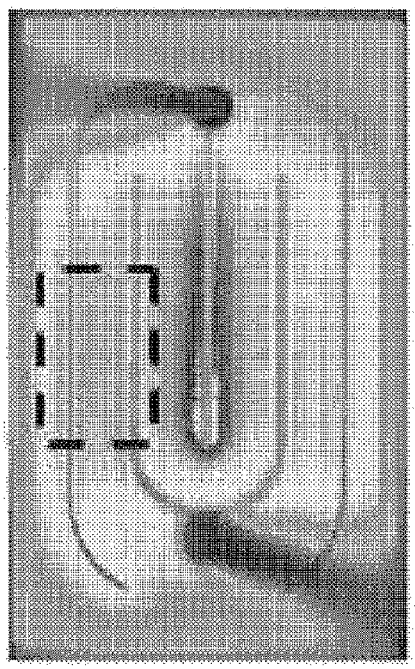
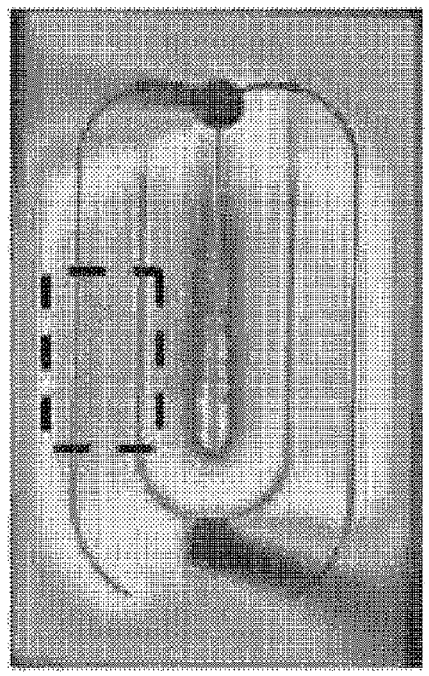

LIGHT EMITTING DIODE HAVING IMPROVED CURRENT SPREADING EFFICIENCY, IMPROVED MECHANICAL RELIABILITY, OR SOME COMBINATION THEREOF

CROSS-REFERENCE TO RELATED APPLICATIONS

This application is a National Stage Entry of International Application No. PCT/KR2016/005236, filed on May 18, 2016, and claims priority from and the benefit of Korean Patent Application No. 10-2015-0080148, filed on Jun. 5, 2015, which are hereby incorporated by reference for all purposes as if fully set forth herein.

BACKGROUND

Field

Exemplary embodiments of the present disclosure relate to a light emitting diode, and more particularly, to a light emitting diode which has good current spreading efficiency and improved mechanical reliability.

Discussion of the Background

A light emitting diode (LED) refers to a solid-state device that emits light through conversion of electric energy. The light emitting diode is broadly applied to various light sources for backlight units, lighting, signal boards, large displays, and the like. With enlargement of LED markets for lighting and application ranges to high current and high output fields, there is a need for improvement in characteristics of light emitting diodes for stable operation upon high current driving. Particularly, there is a need for a light emitting diode capable of suppressing a droop phenomenon causing rapid decrease in luminous efficacy (lm/W) upon driving of the light emitting diode at high current.

SUMMARY

Exemplary embodiments of the present disclosure provide a light emitting diode that can secure stable high current driving. Furthermore, exemplary embodiments of the present disclosure provide a light emitting diode that has improved current spreading efficiency and reliability.

In accordance with one exemplary embodiment of the present disclosure, a light emitting diode includes: a light emitting structure including a first conductivity type semiconductor layer and a plurality of mesas including a second conductivity type semiconductor layer disposed on the first conductivity type semiconductor layer and an active layer interposed between the first conductivity type semiconductor layer and the second conductivity type semiconductor layer, the first conductivity type semiconductor layer including an exposed region between the plurality of mesas; a first electrode disposed on the first conductivity type semiconductor layer and electrically connected to the first conductivity type semiconductor layer; a current blocking layer disposed on a portion of the plurality of mesas and a portion of the exposed region; a transparent electrode layer disposed on a portion of the plurality of mesas and a portion of the exposed region and partially covering the second conductivity type semiconductor layer and the current blocking layer; and a second electrode disposed on the current blocking layer and the transparent electrode layer and electrically connected to the second conductivity type semiconductor layer, wherein the current blocking layer includes a connecting portion extending from a first mesa of the plurality of mesas to a second mesa of the plurality of mesas adjacent to the first mesa, and a protruding portion protruding from the connecting portion and disposed on the exposed region.

The first conductivity type semiconductor layer may include a first side surface adjacent to the connecting portion, a second side surface opposite to the first side surface, and third side surfaces disposed between the first side surface and the second side surface and intersecting each of the first side surface and the second side surface, and the protruding portion may protrude towards the first side surface or the second side surface.

The plurality of mesas may include a plurality of second mesas and a first mesa interposed between the plurality of second mesas; the second electrode may include a second bonding pad disposed on the first mesa and between the connecting portions adjacent to each other; the first electrode may include a first bonding pad disposed between the first mesa and the second side surface; and the light emitting diode may have a symmetrical structure with respect to an imaginary line intersecting the first bonding pad and the second bonding pad.

The second electrode may include an upper extension portion extending from the second bonding pad, and the upper extension portion may include a first upper extension portion disposed on the connecting portion and adjoining the second bonding pad, and a second upper extension portion parallel to the third side surfaces.

A shortest distance between the first upper extension portion and the first side surface may be less than a shortest distance between a central portion of the second bonding pad and the first side surface.

A distance between a distal end of the second upper extension portion and the first side surface may be greater than a distance between the distal end of the second upper extension portion and the second side surface.

The second upper extension portion may include a second section disposed on the second mesa and parallel to the third side surfaces.

The second upper extension portion may further include a first section disposed on the first mesa and between the first bonding pad and the second bonding pad while adjoining the second bonding pad; and the second section may have a greater length than the first section.

The second section may have a greater width than the first section.

The first electrode may include a lower extension portion connected to the first bonding pad, and a distance between a distal end of the lower extension portion and the second side surface may be greater than the distance between a distal end of the lower extension portion and the first side surface.

The lower extension portion may include a first lower extension portion disposed on the exposed region.

The lower extension portion may include a second lower extension portion disposed between the first bonding pad and the second bonding pad.

A portion of the second mesa may be disposed between the first mesa and the first side surface.

A distal end of the second section may be directed towards an imaginary line intersecting the first bonding pad and the second bonding pad.

The plurality of mesas may further include a plurality of third mesas each interposed between the second mesa and the third side surface; the first mesa may be disposed between the plurality of third mesas; and the second upper extension portion may further include a third section disposed on each third mesa and parallel to the third side surface.

The third section may have a greater length than the second section. With this structure, a deviation of the shortest distances between the second upper extension portion and the first bonding pad can be reduced.

The third section may have a greater width than the second section.

A portion of the second section may be disposed on the first mesa and a region of the exposed region disposed between the first mesa and each second mesa.

The protruding portion may include a first protruding portion; a distance between a distal end of the first protruding portion and the second side surface may be smaller than a distance between the first protruding portion and the first side surface; and each of the second sections may be disposed on the first protruding portion.

Each mesa of the plurality of mesas may be same size.

In accordance with another exemplary embodiment of the present disclosure, a light emitting diode includes: a light emitting structure including a first conductivity type semiconductor layer, and a plurality of mesas including a second conductivity type semiconductor layer disposed on the first conductivity type semiconductor layer and an active layer interposed between the first conductivity type semiconductor layer and the second conductivity type semiconductor layer, the first conductivity type semiconductor layer including an exposed region between the plurality of mesas; a first electrode disposed on the first conductivity type semiconductor layer and electrically connected to the first conductivity type semiconductor layer; a current blocking layer disposed on a portion of the plurality of mesas and a portion of the exposed region; a transparent electrode layer disposed on a portion of the plurality of mesas and a portion of the exposed region and partially covering the second conductivity type semiconductor layer and the current blocking layer; and a second electrode disposed on the current blocking layer and the transparent electrode layer and electrically connected to the second conductivity type semiconductor layer, wherein the current blocking layer includes a connecting portion extending from a first mesa of the plurality of mesas to a second mesa of the plurality of mesas adjacent to the first mesa; the plurality of mesas includes a first mesa and a second mesa disposed adjacent to each other; the connecting portion includes a first connecting portion disposed on the first mesa and the second mesa; and the first connecting portion includes a first opening exposing an upper surface of the first mesa and a second opening exposing an upper surface of the second mesa, each of the first opening and the second opening including at least one concave portion.

The second electrode may include a second bonding pad disposed on the first connecting portion; the first electrode may include a first bonding pad interposed between the first mesa and the second mesa; and the first opening and the second opening may have a symmetrical structure with respect to an imaginary line intersecting the first bonding pad and the second bonding pad.

Each of the concave portions of the first and second openings may be parallel to an outer periphery of the first connecting portion.

Each of the first opening and the second opening may include at least one convex portion, and the convex portion may be parallel to the outer periphery of the first connecting portion.

The second bonding pad may contact the second conductivity type semiconductor layer through the first opening and the second opening.

The second bonding pad may have a circular shape.

In accordance with a further exemplary embodiment of the present disclosure, a light emitting diode includes: a light emitting structure including a first conductivity type semiconductor layer, and a plurality of mesas including a second conductivity type semiconductor layer disposed on the first conductivity type semiconductor layer and an active layer interposed between the first conductivity type semiconductor layer and the second conductivity type semiconductor layer, the first conductivity type semiconductor layer including an exposed region between the plurality of mesas; a first electrode disposed on the first conductivity type semiconductor layer and electrically connected to the first conductivity type semiconductor layer; a transparent electrode layer disposed on a portion of the plurality of mesas and a portion of the exposed region; a current blocking layer interposed between the transparent electrode layer and the second conductivity type semiconductor layer and interposed between the transparent electrode layer and the exposed region; and a second electrode disposed on the current blocking layer to partially cover the transparent electrode layer and electrically connected to the second conductivity type semiconductor layer, wherein the transparent electrode layer includes a plurality of first regions disposed on the plurality of mesas and a second region disposed on the exposed region and adjoining the plurality of first regions.

Portions of the transparent electrode layer disposed on the plurality of mesas may be connected to each other.

A side surface of a first region of the plurality of first regions may be parallel to a side surface of a mesa of the plurality of mesas.

The current blocking layer may include a connecting portion disposed between the second region and the exposed region.

A portion of the connecting portion on the exposed region may have a greater width than a portion of the second region disposed on the exposed region.

A portion of the second region disposed on the exposed region may have a greater width than a portion of the second electrode disposed on the exposed region.

According to exemplary embodiments of the present disclosure, the light emitting diode includes a plurality of mesas connected to each other in parallel, thereby improving the droop phenomenon and luminous uniformity during high current driving. Further, the current blocking layer includes a protruding portion and the transparent electrode layer may be disposed on the protruding portion, thereby improving reliability of the light emitting diode. In addition, openings of the current blocking layer prevent defects such as detachment of the bonding pad, thereby improving reliability of the light emitting diode. Furthermore, current spreading efficiency of the light emitting diode can be improved by the shapes of the upper extension portion and the lower extension portion.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 14A and FIG. 14B are images comparing characteristics of a light emitting diode (Inventive Example) of FIG. 6 with characteristics of a typical light emitting diode (Comparative Example).

DETAILED DESCRIPTION OF THE ILLUSTRATED EMBODIMENTS

Figure 1:
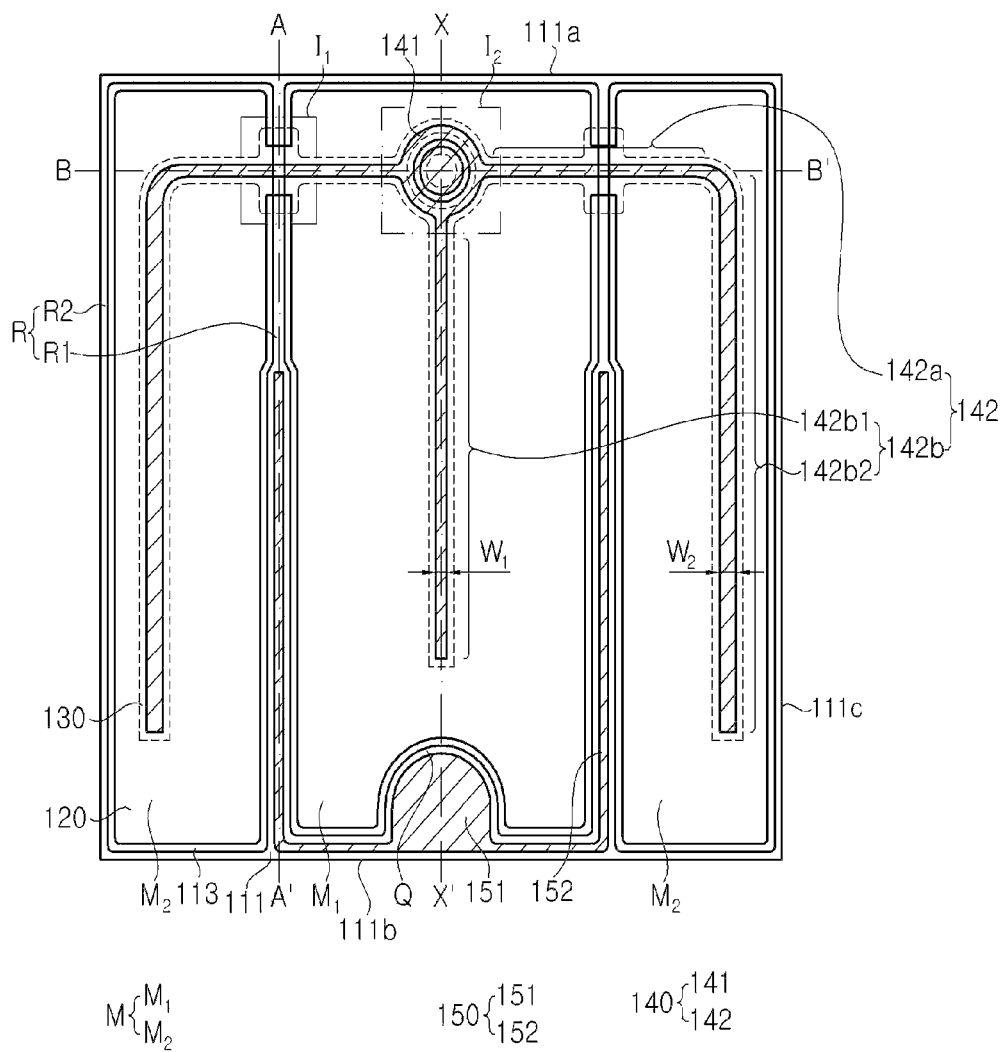
FIG. 1 is a plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2:
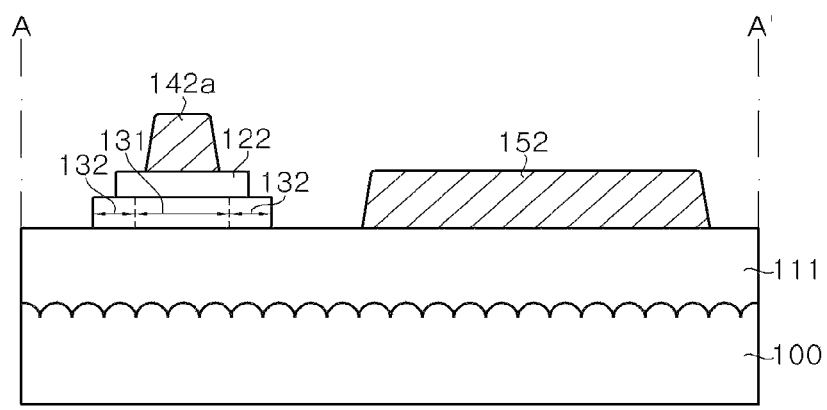
FIG. 2 is a cross-sectional view of the light emitting diode according to the exemplary embodiment of the present disclosure.
Figure 3:
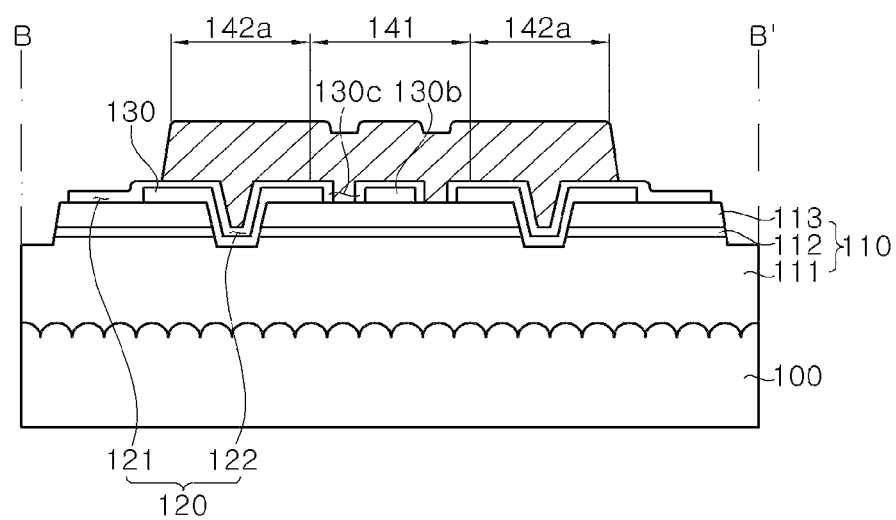
FIG. 3 is a cross-sectional view of the light emitting diode according to the exemplary embodiment of the present disclosure.
Figure 4:
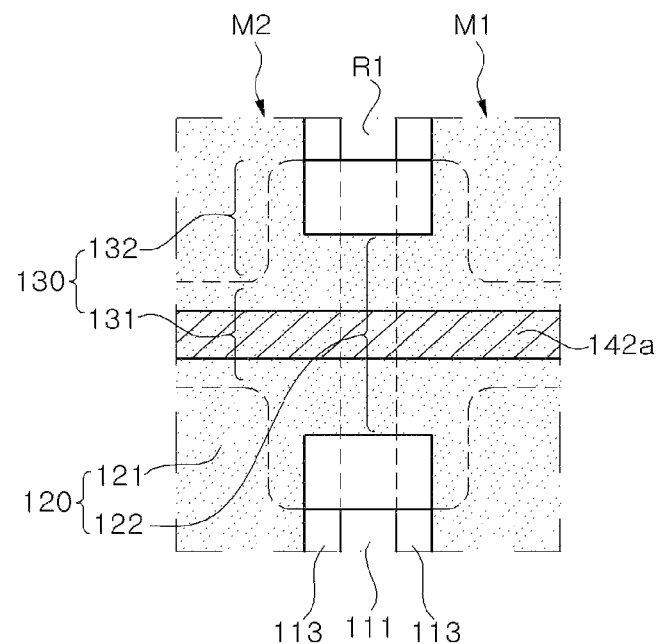
FIG. 4 is an enlarged view of Part I1 of the light emitting diode according to the exemplary embodiment of the present disclosure.
Figure 5:
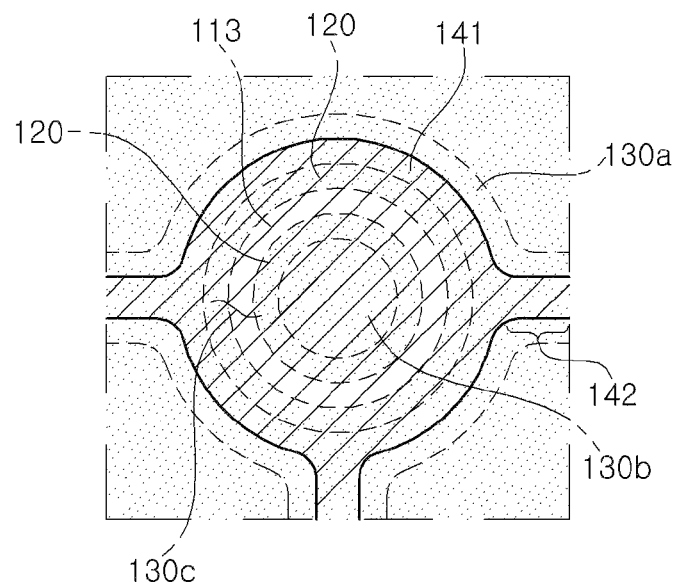
FIG. 5 is an enlarged view of Part I2 of the light emitting diode according to the exemplary embodiment of the present disclosure.

FIG. 1 to FIG. 5 are plan views and cross-sectional views of a light emitting diode according to one exemplary embodiment of the present disclosure. FIG. 1 is a plan view of the light emitting diode, FIG. 2 is a cross-sectional view taken along line A-A' of FIG. 1, FIG. 3 is a cross-sectional view taken along line B-B' of FIG. 1, and FIG. 4 is an enlarged view of Part I1 of the light emitting diode shown in FIG. 1. FIG. 5 is an enlarged view of Part I2 of the light emitting diode shown in FIG. 1.

Referring to FIG. 1 to FIG. 5, the light emitting diode according to the exemplary embodiment includes a light emitting structure 110, a transparent electrode layer 120, a current blocking layer 130, a first electrode 150, and a second electrode 140, and may further include a substrate 100 disposed on a lower surface of the light emitting structure 110.

The substrate 100 may be selected from any substrates that allow a first conductivity type semiconductor layer 111, an active layer 112, and a second conductivity type semiconductor layer 113 to be grown thereon, and may be, for example, a sapphire substrate, a silicon carbide substrate, a gallium nitride substrate, an aluminum nitride substrate, a silicon substrate, or the like. In this exemplary embodiment, the substrate 100 may be a patterned sapphire substrate (PSS).

The light emitting structure 110 includes the first conductivity type semiconductor layer 111, the second conductivity type semiconductor layer 113 disposed on the first conductivity type semiconductor layer 111, and the active layer 112 interposed between the first conductivity type semiconductor layer 111 and the second conductivity type semiconductor layer 113. The first conductivity type semiconductor layer 111, the active layer 112 and the second conductivity type semiconductor layer 113 may include III-V based compound semiconductors, for example, nitride-based semiconductor such as (Al,Ga,In)N. The first conductivity type semiconductor layer 111 may include n-type dopants (for example, Si) and the second conductivity type semiconductor layer 113 may include p-type dopants (for example, Mg), or vice versa. The active layer 112 may include a multi-quantum well (MQW) structure and the composition ratio of the active layer may be determined so as to emit light having a predetermined peak wavelength.

The first conductivity type semiconductor layer 111 includes a first side surface 111a, a second side surface 111b facing the first side surface 111a, and third side surfaces 111c disposed between the first side surface 111a and the second side surface 111b and each intersecting the first side surface 111a and the second side surface 111b.

The light emitting structure 110 may include a plurality of mesas M including the second conductivity type semiconductor layer 113 and the active layer 112. The mesas (M) may be formed by partially removing the second conductivity type semiconductor layer 113 and the active layer 112. Specifically, the mesas M may be formed by patterning the second conductivity type semiconductor layer 113 and the active layer 112 such that the first conductivity type semiconductor layer 111 is partially exposed therethrough. Each of the mesas M may have an inclined side surface formed by photoresist reflow or the like. The plurality of mesas M may include a first mesa M1 and a second mesa M2 adjacent to each other. The second mesa M2 may be provided in plural and the first mesa M1 may be disposed between the second mesas M2. Although the light emitting diode according to this exemplary embodiment is illustrated as including three mesas M1, M2, it should be understood that other implementations are also possible and the light emitting diode may include four or more mesas.

An exposed region R is formed by exposing the first conductivity type semiconductor layer 111 during formation of the plurality of mesas M. The plural mesas M may be separated from each other on a single first conductivity type semiconductor layer 111 by the exposed region R. In addition, with the exposed region R, the light emitting diode can secure a region in which a material such as an insulation layer can be deposited to protect an outer surface of the light emitting diode.

The exposed region R may include first exposed regions R1 exposed between the plurality of mesas M and a second exposed region R2 formed along an outer periphery of the first conductivity type semiconductor layer 111. For example, as shown in FIG. 1, the first exposed regions R1 may extend from the first side surface 111a of the first conductivity type semiconductor layer 111 to the second side surface 111b thereof. Furthermore, the first exposed regions R1 may be elongated parallel to the third side surface 111c. The second exposed region R2 may be formed along at least part of a side surface of each of the mesas M so as to be disposed between the mesas M and the side surfaces of the first conductivity type semiconductor layer 111. The first exposed regions R1 may extend from the second exposed region R2.

The exposed region R may further include a convex portion Q. For example, as shown in FIG. 1, the second exposed region R2 may include the convex portion Q, which is disposed to face the first mesa M1. In addition, the convex portion Q may be disposed near the middle point of the second side surface 111b and protrude towards the first side surface 111a.

The first electrode 150 is disposed on the first conductivity type semiconductor layer 111 and may be electrically connected to the first conductivity type semiconductor layer 111. The first electrode 150 may include a first bonding pad 151 and a lower extension portion 152 connected to the first bonding pad 151.

The first bonding pad 151 may be disposed between the first mesa M1 and the second side surface 111b. Each of the first exposed regions R1 may be formed between the first mesa M1 and the second mesas M2, and the first bonding pad 151 may be disposed between these first exposed regions R1. The first bonding pad 151 may be disposed on the convex portion Q, at which the first conductivity type semiconductor layer 111 is partially exposed. Electric current supplied to the light emitting structure 110 from an external power source of the light emitting diode through a second bonding pad 141 is discharged from the light emitting structure 110 through the first bonding pad 151.

The lower extension portion 152 may be disposed along the side surfaces of the mesas M. For example, a portion of the lower extension portion 152 may be disposed on the first exposed region R1, as shown in FIG. 1. The lower extension portion 152 prevents current crowding near the first bonding pad 151, thereby improving current spreading efficiency.

A distance between a distal end of the lower extension portion 152 and the second side surface 111b may be greater than a distance between the distal end of the lower extension portion 152 and the first side surface 111a. Accordingly, electric current can be easily supplied to the mesa M disposed between the lower extension portions 152, for example, to the first mesa M1, thereby improving luminous intensity.

Furthermore, a distance between the distal end of the lower extension portion 152 and the second bonding pad 141 may be smaller than a distance between the distal end of the lower extension portion 152 and the first bonding pad 151. Since this structure can secure a wider area of the lower extension portions 152 to which electric current supplied to the second bonding pad 141 can be applied, electric current can be easily supplied to the mesas M around the second bonding pad 141 and the lower extension portion 152, thereby further improving luminous intensity.

The current blocking layer 130 may be disposed on the light emitting structure 110. Specifically, as shown in FIG. 1 to FIG. 4, the current blocking layer 130 may be disposed on a portion of the plural mesas M and a portion of the first exposed regions R1.

The current blocking layer 130 can prevent current crowding due to direct supply of electric current to the semiconductor layers when electric current is supplied to the electrodes. Accordingly, the current blocking layer 130 may have insulating properties, include an insulating material, and be composed of a single layer or multiple layers. For example, the current blocking layer 130 may include SiOx or SiNx, or a distributed Bragg reflector in which insulating material layers having different indexes of refraction are stacked one above another. That is, the current blocking layer 130 may exhibit light transmittance or light reflectivity.

The current blocking layer 130 may include a first current blocking layer 130a and a second current blocking layer 130b disposed on an upper surface of the mesa M. The first current blocking layer 130a may include an opening 130c that exposes the second conductivity type semiconductor layer 113. The second current blocking layer 130b may be disposed in the opening 130c to be separated from the first current blocking layer 130a. The first current blocking layer 130a and the second current blocking layer 130b may be disposed between connecting portions 131. The first current blocking layer 130a may have a circular shape, but is not limited thereto. The opening 130c may have a shape corresponding to an outer periphery of the first current blocking layer 130a. For example, in the structure wherein the first current blocking layer 130a has a circular shape, the opening 130c may also have a circular shape. The second current blocking layer 130b may have a shape corresponding to the shape of the opening 130c. For example, in the structure wherein the opening 130c has a circular shape, the second current blocking layer 130b may also have a circular shape.

The current blocking layer 130 may include at least one connecting portion 131 extending from one mesa M to another mesa M adjacent to the one mesa M among the plurality of mesas M. As shown in FIG. 1, the connecting portion 131 may be disposed near the first side surface 111a, but is not limited thereto. The connecting portion 131 may be disposed in a region that extends from a portion of the first mesa M1 and reaches a portion of the second mesas M2 via the first exposed regions R1. The connecting portion 131 prevents the second electrode 140 from electrically contacting the first conductivity type semiconductor layer 111 and insulates the transparent electrode layer 120 from the first conductivity type semiconductor layer 111. Referring to FIG. 1 and FIG. 4, the connecting portion 131 may have a rectangular shape, without being limited thereto. Alternatively, the connecting portion may have a circular shape.

The current blocking layer 130 may include a protruding portion 132 protruding from the connecting portion 131 to be disposed on the first exposed regions R1. For example, as shown in FIG. 1 to FIG. 4, the protruding portion 132 may extend from a boundary between the first mesa M1 and the first exposed region R1 to a boundary between the second mesa M2 and the first exposed region R1. The protruding portion 132 may protrude from the second electrode 140 in a direction parallel to the side surfaces of the first mesa M1 and the second mesa M2. Specifically, the protruding portion 132 may protrude towards both the first side surface 111a and the second side surface 111b. A portion of the transparent electrode layer 120 described below may be disposed on the protruding portion 132. When the current blocking layer is not formed in a sufficient region on the first exposed region R1, a region in which the transparent electrode layer 120 will be formed can be excessively narrowed. In this case, the transparent electrode layer can have negative reliability and can adjoin the first conductivity type semiconductor layer, thereby causing increase in failure rate. Conversely, since the light emitting diode according to the exemplary embodiment includes the protruding portion 132, it is possible to secure a sufficient region in which the transparent electrode layer 120 will be formed on the first exposed region R1, whereby the transparent electrode layer 120 can be effectively insulated from the first conductivity type semiconductor layer 111. Accordingly, the light emitting diode according to the exemplary embodiment can reduce the defect rate while improving reliability.

Furthermore, the protruding portion 132 may at least partially cover the first mesa M1 and the second mesas M2. Specifically, the protruding portion 132 may be disposed not only on the first exposed regions R1, but also on the side surfaces of the first mesa M1 and the second mesas M2. Furthermore, the protruding portion 132 may also be disposed on an upper surface of the first mesa M1 and upper surfaces of the second mesas M2.

The transparent electrode layer 120 may be disposed on a portion of the plural mesas M and a portion of the first exposed regions R1. For example, as shown in FIGS. 1 and 4, the transparent electrode layer 120 may partially cover the second conductivity type semiconductor layer 113 and the current blocking layer 130. A portion of the transparent electrode layer 120 may be disposed on the current blocking layer 130. Accordingly, the current blocking layer 130 may be disposed between the transparent electrode layer 120 and the second conductivity type semiconductor layer 113 and between the transparent electrode layer 120 and the first exposed regions R1. The transparent electrode layer 120 may form ohmic contact with the second conductivity type semiconductor layer 113. The transparent electrode layer 120 can act to spread electric current supplied from the second electrode 140 in the horizontal direction and has high transmittance to allow light emitted from the active layer 112 to pass therethrough. The transparent electrode layer 120 may include a material having light transmittance and electrical conductivity, for example, at least one of a conductive oxide, such as ITO, ZnO and IZO, and a light transmitting metal such as Ni/Au.

The transparent electrode layer 120 may include first regions 121 disposed on the plurality of mesas M and second regions 122 extending from the first regions 121. As shown in FIGS. 3 and 4, each of the second regions 122 connects the first regions 121 disposed on the mesas M to each other such that electric current applied to the transparent electrode layer 120 on one mesa M through the second electrode 140 can spread to the transparent electrode layer 120 on another mesa M adjacent to the one mesa M. This structure provides more efficient current spreading, thereby further improving luminous uniformity of the light emitting diode.

A side surface of the first region 121 may be parallel to the side surface of the mesa M. A portion of the transparent electrode layer 120, specifically a portion of the first region, may be disposed on the protruding portion 132. In this case, the transparent electrode layer 120 may be disposed closer to the side surfaces of the mesas M to allow electric current to be supplied to a region near the side surfaces of the mesas M, thereby improving luminous efficacy.

The second regions 122 may be disposed on the first exposed regions R1 and adjoin the first regions 121. Accordingly, a portion of the current blocking layer 130, that is, the connecting portion 131, is disposed between the second region 122 and the first exposed region R1, thereby preventing electrical connection between the second region 122 and the first conductivity type semiconductor layer 111. A portion of the connecting portion 131 disposed on the first exposed region R1 may have a larger area than a portion of the second region 122 disposed on the first exposed region R1. Accordingly, the second regions 122 can be effectively separated from the first conductivity type semiconductor layer 111.

Portions of the transparent electrode layer 120 disposed on the plurality of mesas M may be connected to each other. That is, the transparent electrode layer 120 may be disposed on each of the plurality of mesas M instead of being divided into several regions. Specifically, in the light emitting diode, the transparent electrode layer 120 may be present as a monolithic layer instead of plural layers. Generally, since the transparent electrode layer is divided into plural transparent electrode layers disposed on the mesas to be separated from each other, a current spreading region is also restricted to each mesa by each of the transparent electrode layers. Conversely, according to the exemplary embodiments, electric current supplied to the transparent electrode layer 120 on the mesas M through the second electrode 140 can be spread to the overall area of the light emitting diode through the monolithic transparent electrode layer 120.

The second electrode 140 may be disposed on the current blocking layer 130 to partially cover the transparent electrode layer 120. The second electrode 140 may be disposed on the second conductivity type semiconductor layer 113 to be electrically connected thereto.

The second electrode 140 may include the second bonding pad 141 and at least one upper extension portion 142. The second bonding pad 141 may be disposed on the first mesa M1 and may be placed between the plural connecting portions 131 adjacent to each other. The second bonding pad 141 acts to transfer electric current to the light emitting structure 110 when electric current is supplied from an external power source of the light emitting diode through wires (not shown). The second bonding pad 141 may have a shape corresponding to the shape of the first current blocking layer 130a. For example, as shown in FIG. 1 and FIG. 5, the second bonding pad 141 may have a circular shape. In this exemplary embodiment, the area of the second bonding pad 141 can be minimized, thereby securing a bonding area to a solder while securing a luminous region. Furthermore, since the second bonding pad 141 has a circular shape without an angled corner, current crowding in the second bonding pad 141 can be reduced.

The second bonding pad 141 may be disposed on the first current blocking layer 130a and the second current blocking layer 130b. The second bonding pad 141 contacts the second conductivity type semiconductor layer 113 through the opening 130c. Here, a step is formed between the first current blocking layer 130a and the second current blocking layer 130b and prevents defects such as detachment of the second bonding pad 141. Furthermore, the step forms a depressed portion at a location of the upper surface of the second bonding pad 141 corresponding to the location of the opening 130c. A wire can be stably bonded to the second bonding pad 141 through the depressed portion.

The light emitting diode according to this exemplary embodiment may have a symmetrical structure with respect to an imaginary line (X-X') intersecting the first bonding pad 151 and the second bonding pad 141. With this structure, the light emitting diode can permit the same shape of current spreading in plural regions divided by the imaginary line.

The upper extension portion 142 may extend from the second bonding pad 141. The upper extension portion 142 is formed only on one region of the light emitting diode to suppress current crowding, thereby improving luminous uniformity of the light emitting diode.

The upper extension portion 142 may include a first upper extension portion 142a adjoining the second bonding pad 141 and disposed on at least one connecting portion 131. As shown in FIG. 1, the first upper extension portion 142a may have a linear shape, without being limited thereto. A distance between the distal end of the lower extension portion 152 and the first upper extension portion 142a may be smaller than a distance between the distal end of the lower extension portion 152 and the second side surface 111b. This structure allows efficient supply of electric current to the mesas M between the distal end of the lower extension portion 152 and the first upper extension portion 142a. Furthermore, since the first exposed regions R1 are present, instead of the mesas M, on the shortest path between the distal end of the lower extension portion 152 and the first upper extension portion 142a, electric current can bypass the shortest path to spread to the regions of the first mesa M1 and the second mesa M2 near the shortest path instead of flowing along the shortest path. Accordingly, luminous intensity between the lower extension portion 152 and a portion of the first upper extension portion 142a disposed on the mesas M can be improved.

The upper extension portion 142 may include second upper extension portions 142b. The second upper extension portions 142b may be parallel to the third side surfaces 111c. The second upper extension portions 142b may extend from the first upper extension portion 142a. The second upper extension portions 142b may extend towards one side of the first conductivity type semiconductor layer 111 near the first bonding pad 151. A distance between a distal end of each second upper extension portion 142b and the first side surface 111a may be greater than a distance between the distal end of each second upper extension portion 142b and the second side surface 111b. This structure can suppress current crowding around the second bonding pad 141, thereby improving luminous uniformity of the light emitting diode.

The second upper extension portions 142b may include a first section 142b1 and second sections 142b2. The first section 142b1 may be disposed on the first mesa M1 and adjoin the second bonding pad 141. The first section 142b1 may be disposed between the first bonding pad 151 and the second bonding pad 141.

The second section 142b2 may be disposed on the second mesa M2 and be parallel to the third side surface 111c. The second sections 142b2 may have a greater length than the first section 142b1. With this structure, deviation in the shortest distances between the second upper extension portions 142b and the first bonding pad 151 can be reduced. Accordingly, deviation in the amount of electric current applied to the second upper extension portions 142b can be reduced to have similar luminous intensity of the mesas M on which the second upper extension portions 142b are disposed, respectively. As a result, the light emitting diode can have improved luminous uniformity.

A width $W_2$ of the second sections 142b2 may be greater than a width $W_1$ of the first section 142b1. Typically, the amount of electric current supplied to the second upper extension portion 142b through the second bonding pad 141 decreases with increasing distance between the second bonding pad 141 and the second upper extension portion disposed on the mesas M. In this exemplary embodiment, since the second sections 142b2 disposed away from the second bonding pad 141 have a relatively large width $W_2$, a large amount of electric current can be supplied to the second sections 142b2, as compared with the aforementioned typical case. Accordingly, luminous intensity of the mesas M disposed away from the second bonding pad 141 can be improved, thereby improving luminous uniformity of the light emitting diode. For example, the second sections 142b2 may have a width $W_2$ of 6 μm and the first section 142b1 may have a width $W_1$ of 5 μm.

Figure 6:
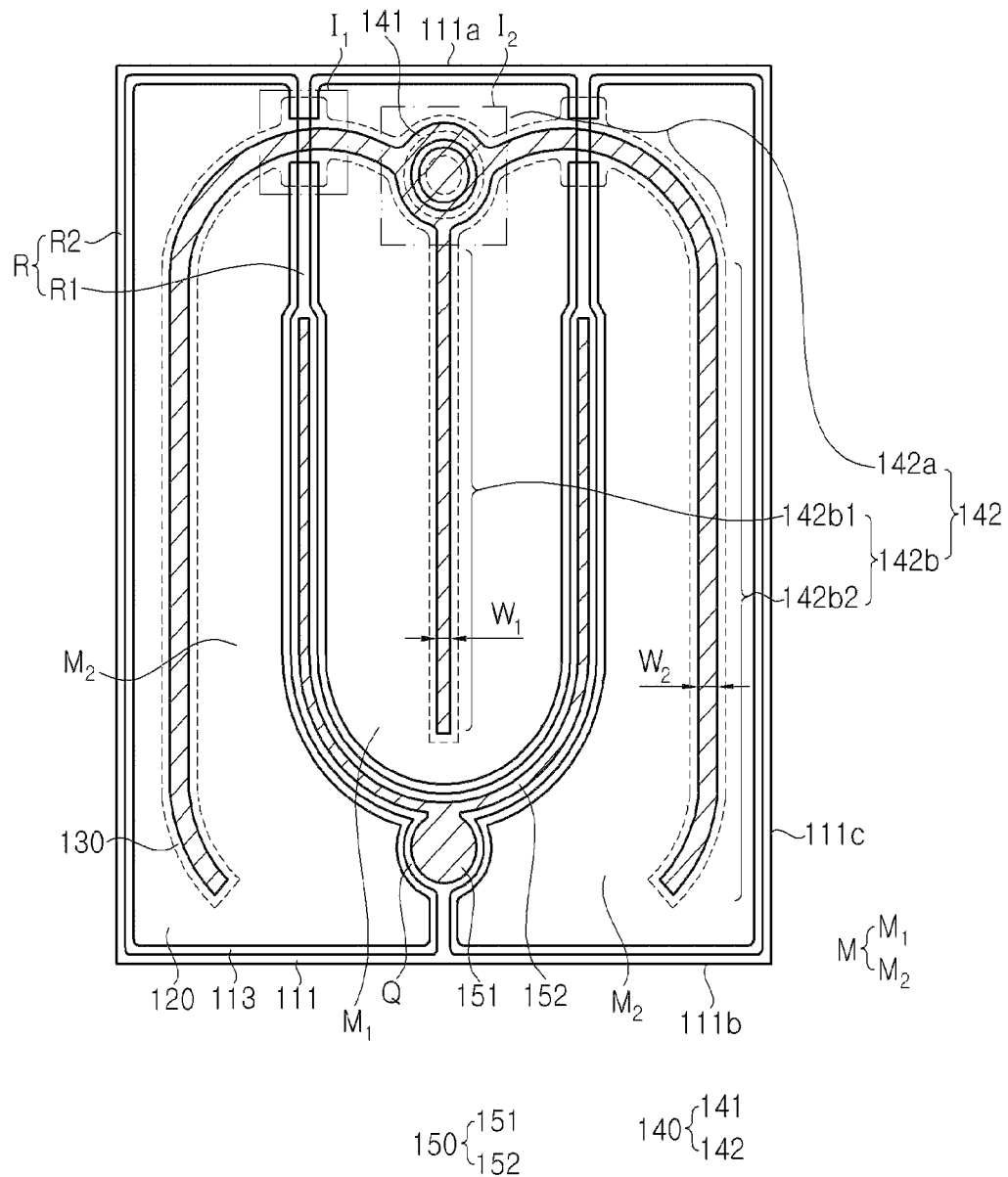
FIG. 6 is a plan view of a light emitting diode according to another exemplary embodiment of the present disclosure.

FIG. 6 is a plan view of a light emitting diode according to another exemplary embodiment of the present disclosure. The light emitting diode of FIG. 6 is similar to the light emitting diode described with reference to FIG. 1 to FIG. 5. Specifically, the light emitting diode of FIG. 6 includes parts I1, I2, which are shown in enlarged views of FIG. 4 and FIG. 5. Here, the light emitting diode of FIG. 6 is different from the light emitting diode described with reference to FIG. 1 to FIG. 5 in terms of the mesas M and the upper extension portion 142b, and the following description will focus on these different features.

According to this exemplary embodiment, the light emitting diode includes a plurality of mesas M and the first bonding pad 151 may be surrounded by the plurality of mesas M. In the light emitting diode of FIG. 1, the second exposed region R2 includes the convex portion Q and the first bonding pad 151 is disposed on the convex portion Q and surrounded only by the first mesa M1. Accordingly, electric current supplied through the second bonding pad 141 is excessively concentrated on the first mesa M1 and is not sufficiently supplied to the second mesas M2, which do not directly surround the first bonding pad 151. Conversely, in the light emitting diode shown in FIG. 6, since the convex portion Q is disposed on the first exposed region R1, the first bonding pad 151 may be surrounded by the plurality of mesas M, that is, by the first mesa M1 and the second mesas M2. Accordingly, electric current can be more uniformly distributed to the plurality of mesas M, thereby improving luminous uniformity of the light emitting diode.

In the light emitting diode according to this exemplary embodiment, one side surface of the first mesa M1 is disposed along the first side surface 111a and the other side surface of the first mesa M1 is surrounded by the second mesas M2. Specifically, a portion of the second mesa M2 may be placed between the first mesa M1 and the second side surface 111b. As such, the light emitting diode of FIG. 1 includes a plurality of first exposed regions R1 connected to each other, whereas the first conductivity type semiconductor layer 111 according to this exemplary embodiment includes a single first exposed region R1. The first bonding pad 151 is disposed in a region of the first exposed region R1 surrounded by the first mesa M1 and the second mesas M2.

The plurality of mesas M may have the same size. Generally, since electric current crowds around the first bonding pad 151, the mesa M surrounding the first bonding pad 151 has a larger size than other mesas M not surrounding the first bonding pad 151. In this exemplary embodiment, since the plurality of mesas M is disposed to surround the first bonding pad 151, the plurality of mesas M may have the same size. Accordingly, the mesas M have the same luminous areas, thereby improving luminous uniformity of the light emitting diode.

In this exemplary embodiment, the first upper extension portion 142a may have a curved shape. Specifically, the first upper extension portion 142a may have a bent shape that is convex towards the first side surface 111a. More specifically, the shortest distance between the first upper extension portion 142a and the first side surface 111a may be smaller than the shortest distance between a central portion of the second bonding pad 141 and the first side surface 111a. When the second bonding pad 141 has a circular shape, the central portion of the second bonding pad 141 is the center of the circle. Accordingly, since the first upper extension portion 142a can be placed near the region of the mesas M adjacent to the first side surface 111a, electric current can be efficiently supplied to the region of the mesas M, thereby improving luminous intensity.

A distal end of each of the second sections 142b2 may be directed towards an imaginary line intersecting the first bonding pad 151 and the second bonding pad 141. Specifically, the distal end of the second section 142b2 may be bent towards the first bonding pad 151. With this structure, electric current can be efficiently supplied to a region of each of the second mesas M2 between the first mesa M1 and the second side surface 111b, thereby improving luminous intensity of the regions thereof.

The second electrode 140 may electrically connect the plurality of mesas M to each other. Specifically, the second conductivity type semiconductor layer 113 of each of the plurality of mesas M is electrically connected to the second conductivity type semiconductor layer 113 of the other mesas M by the second electrode 140, and the plurality of mesas M shares the first conductivity type semiconductor layer 111. Accordingly, the plural mesas M are connected to each other in parallel. With this structure, the light emitting diode can suppress the droop phenomenon during high current driving and have uniform luminous intensity through each of the regions thereof.

The characteristics of the light emitting diode upon high current driving were measured using the light emitting diode of FIG. 6 as an inventive example and a typical light emitting diode as a comparative example, in which the typical light emitting diode has a similar structure to the light emitting diode of FIG. 1 except that the typical light emitting diode includes a single mesa M instead of a plurality of mesas.

Specifically, external quantum efficiency (EQE, 1 m/W) of the light emitting diode was measured while increasing electric current (mA) applied to each of the light emitting diodes of the inventive example and the comparative example. Based on the measurement result, a decrease rate in external quantum efficiency at each current from the highest external quantum efficiency was represented in percentage. As a result, the light emitting diode of the comparative example exhibited external quantum efficiency decrease rates of −2.8% at 65 mA, −4.9% at 100 mA, and −18.2% at 400 mA. Conversely, the light emitting diode of the inventive example exhibited external quantum efficiency decrease rates of −2.5% at 65 mA, −4.6% at 100 mA, and −17.6% at 400 mA, showing that the light emitting diode of the inventive example underwent less decrease in external quantum efficiency than the light emitting diode of the comparative example. Furthermore, it could be seen based on these measurement values that a difference in external quantum efficiency decrease rate between the light emitting diodes of the inventive example and the comparative example gradually increases, as the electric current applied thereto increases, which means that the droop phenomenon of the light emitting diode of the inventive example was improved.

FIG. 14A and FIG. 14B shows pictures illustrating improvement of luminous uniformity of the light emitting diode of the inventive example. The pictures show luminous intensity in each region of the light emitting diodes of the comparative example (FIG. 14A) and the inventive example (FIG. 14B) upon application of high current (280 mA). Referring to FIGS. 14A and 14B, the light emitting diode of the inventive example in which the plural mesas M are connected to each other in parallel exhibited higher luminous intensity in a region (dotted region) along an outer periphery thereof at high current than the light emitting diode of the comparative example. Specifically, although both light emitting diodes exhibited similar luminous intensity at the central portion thereof, the light emitting diode of the inventive example had improved luminous intensity at the outer periphery thereof, thereby reducing a difference in luminous intensity between the central portion of the light emitting diode and the outer peripheral region thereof. Accordingly, the light emitting diode of the inventive example had improved luminous uniformity during high current driving.

Improvement of the droop phenomenon and luminous uniformity as described above is not limited to the light emitting of FIG. 6 and may also be obtained by light emitting diodes according to other exemplary embodiments, in which the plural mesas M are connected to each other in parallel.

Figure 7:
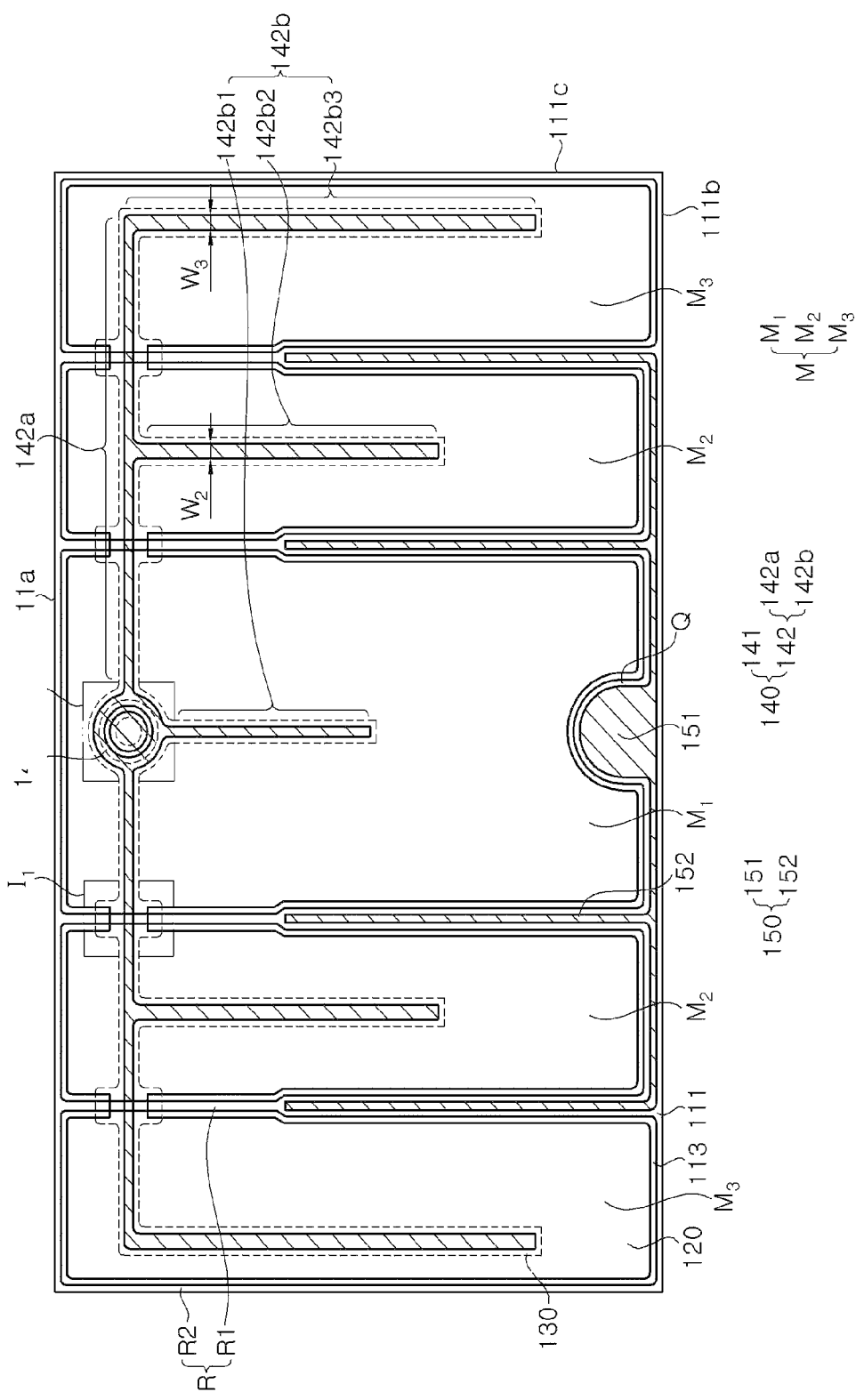
FIG. 7 is a plan view of a light emitting diode according to a further exemplary embodiment of the present disclosure.

FIG. 7 is a plan view of a light emitting diode according to another exemplary embodiment of the present disclosure. The light emitting diode of FIG. 7 is similar to the light emitting diode described with reference to FIG. 1 to FIG. 5. For example, the light emitting diode of FIG. 7 includes the parts I1, I2, which are shown in enlarged views of FIG. 4 and FIG. 5, and the first mesa M1, the second mesas M2 and the exposed region R1 of the light emitting diode of FIG. 7 are similar to those of the light emitting diode according to the above exemplary embodiment. However, the light emitting diode of FIG. 7 is different from the light emitting diode described with reference to FIG. 1 to FIG. 5 in terms of a third mesa M3 and a third section 142b3, and thus the following description will focus on these different features.

The light emitting diode according to this exemplary embodiment may further include a plurality of third mesas M3. Each of the third mesas M3 may be disposed between the second mesa M2 and the third side surface 111c. Furthermore, the first mesa M1 may be disposed between the plural mesas M. The third mesas M3 may have the same size as the second mesa M2, without being limited thereto.

The second upper extension portion 142b may further include third sections 142b3. Each of the third sections 142b3 may be disposed on the third mesa M3. The third sections 142b3 may be parallel to the third side surface 111c. The third sections 142b3 may have a greater length than the second sections 142b2. With this structure, deviation in the shortest distances between the second upper extension portions 142b and the first bonding pad 151 can be reduced. Accordingly, deviation in the amount of electric current applied to the second upper extension portions 142b can be reduced to have similar luminous intensity on the regions of the mesas M, on which the second upper extension portions 142b are disposed, respectively. As a result, the light emitting diode can have improved luminous uniformity.

A width $W_3$ of the third section 142b3 may be greater than the width $W_2$ of the second section 142b2. Since the third sections 142b3 disposed away from the second bonding pad 141 have a relatively large width $W_3$, a large amount of electric current can be supplied to the third sections 142b3, as compared with a typical light emitting diode. Accordingly, luminous intensity of the mesas M disposed away from the second bonding pad 141 can be improved, thereby improving luminous uniformity of the light emitting diode.

Figure 8:
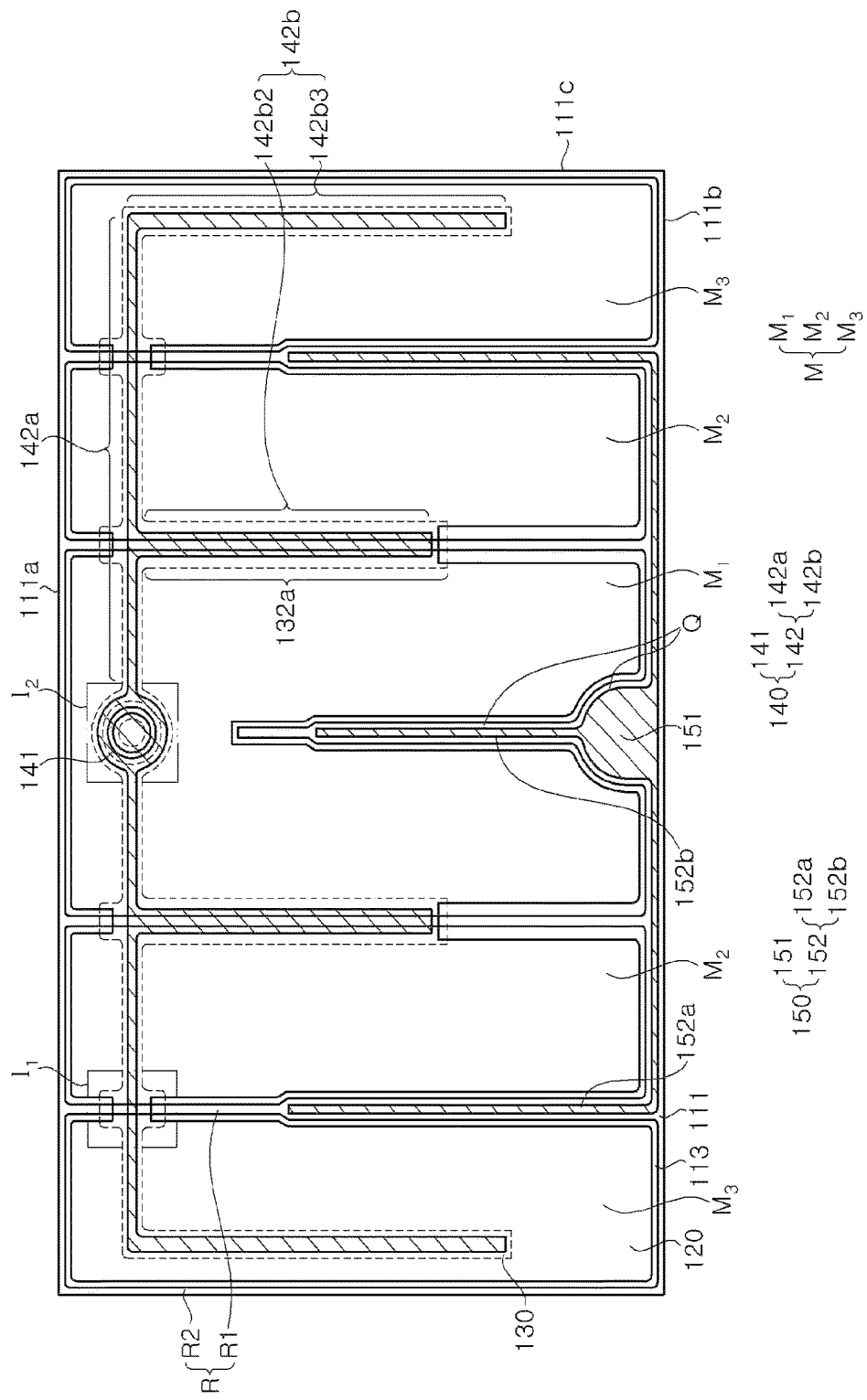
FIG. 8 is a plan view of a light emitting diode according to yet another exemplary embodiment of the present disclosure.

FIG. 8 is a plan view of a light emitting diode according to another exemplary embodiment of the present disclosure. The light emitting diode of FIG. 8 is similar to the light emitting diodes described with reference to FIG. 1 to FIG. 5 and FIG. 7. For example, the light emitting diode of FIG. 8 includes Parts I1, I2, which are shown in enlarged views of FIG. 4 and FIG. 5, and the third sections 142b3 thereof may have a greater length than the second sections 142b2. In addition, the width W3 of the third sections 142b3 may be greater than the width W2 of the second sections 142b2. However, the light emitting diode of FIG. 7 is different from the light emitting diodes described with reference to FIG. 1 to FIG. 5 and FIG. 7 in terms of the locations of the second upper extension portion 142b and the lower extension portion 152, and the following description will focus on these different features.

In the light emitting diode according to this exemplary embodiment, a portion of each of the second sections 142b2 may be disposed on the first mesa M1 and on a region of the first exposed region R1 disposed between the first mesa M1 and the second mesa M2. That is, a portion of the first mesa M1, a portion of the second mesa M2 and a portion of the first exposed region R1 overlap each other along the length of the second section 142b2. With this structure, when electric current is applied to the second sections 142b2, the electric current can be transferred not only to the second mesas M2, but also to the first mesa M1. In addition, a region of the mesa M shielded by the second section 142b2 can be reduced, thereby improving luminous efficacy by securing a sufficient luminous area.

The protruding portion 132 may include a first protruding portion 132a. The first protruding portion 132a may overlap the second section 142b2 along the length of the second section 142b2. A distance between a distal end of the first protruding portion 132a and the second side surface 111b may be smaller than a distance between the distal end of the first protruding portion 132a and the first side surface 111a. Accordingly, the first protruding portion 132a may be elongated towards the second side surface 111b. The second section 142b2 may be disposed on the first protruding portion 132a. Specifically, the entire region of the second section 142b2 may be disposed only on the first protruding portion 132a.

The lower extension portion may include a first lower extension portion 152a and a second lower extension portion 152b.

The first lower extension portion 152a may be disposed on the first exposed region R1. A distal end of the first lower extension portion 152a may be disposed to face the first side surface 111a.

The second lower extension portion 152b may be disposed between the first bonding pad 151 and the second bonding pad 141. A convex portion Q may be elongated towards the second bonding pad 141 and the second lower extension portion 152b may be disposed on the convex portion Q. With this structure, the light emitting diode can prevent excessive current crowding near the first bonding pad 151. Further, electric current can be sufficiently supplied to regions between the second sections 142b2 and the second lower extension portion 152b disposed on the convex portion Q, thereby improving luminous intensity of the regions. The light emitting diode of FIG. 8 does not include the first section 142b1. The light emitting diode according to this exemplary embodiment can improve current spreading performance and luminous efficacy through the second lower extension portion 152b of the first electrode 150 instead of the first section 142b1.

Figure 9:
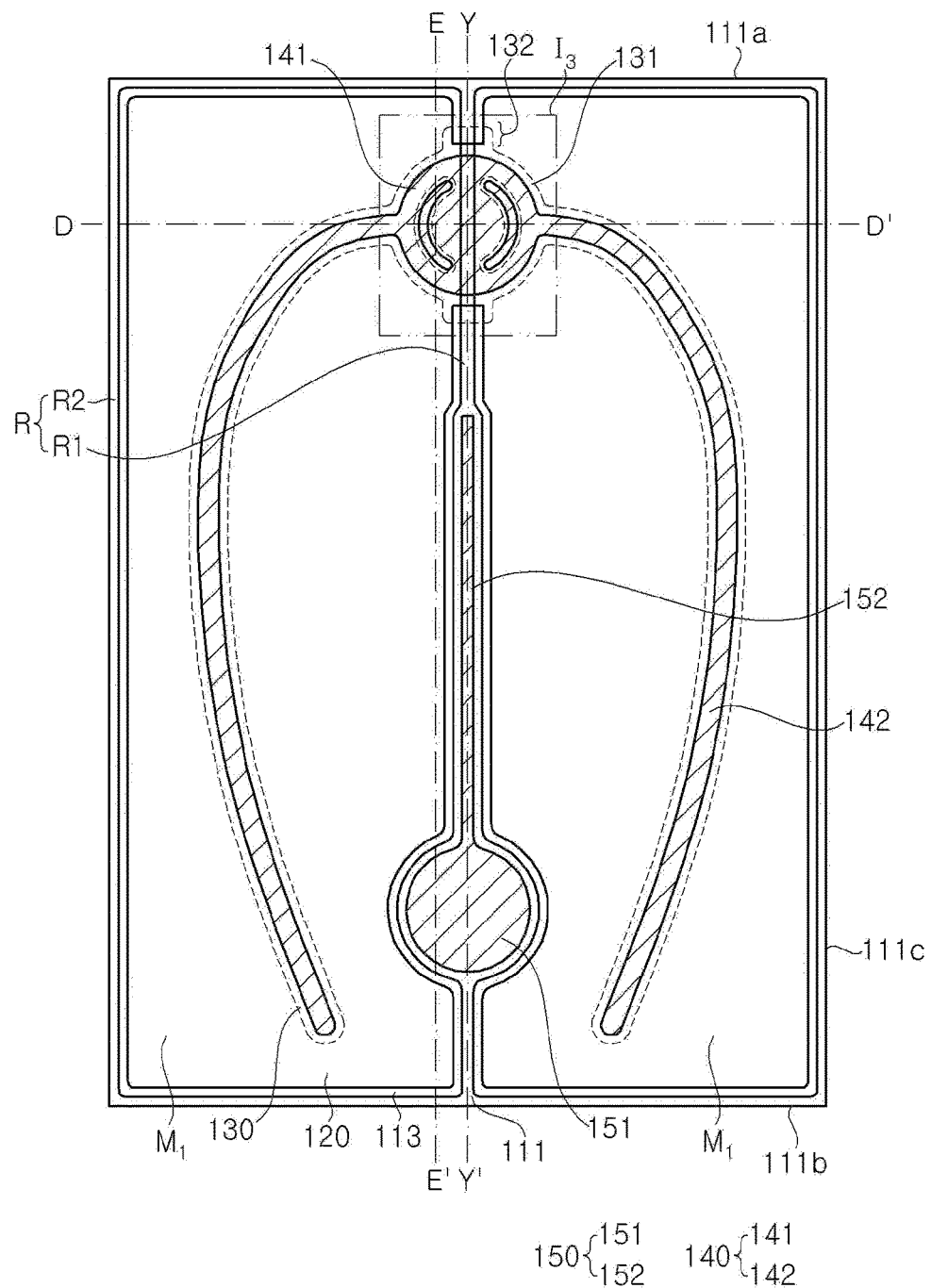
FIG. 9 is a plan view of a light emitting diode according to yet another exemplary embodiment of the present disclosure.
Figure 10:
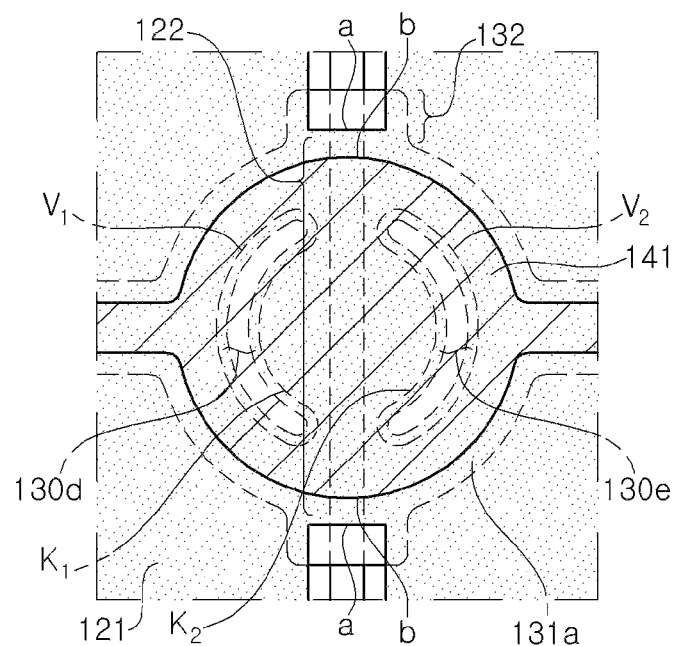
FIG. 10 is an enlarged view of Part $I_3$ of the light emitting diode according to yet another exemplary embodiment of the present disclosure.
Figure 11:
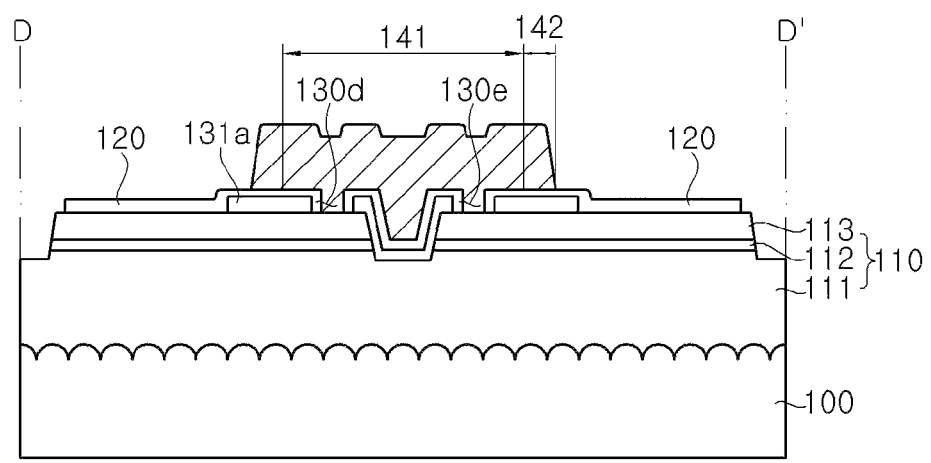
FIG. 11 is a cross-sectional view of the light emitting diode according to yet another exemplary embodiment of the present disclosure.
Figure 12:
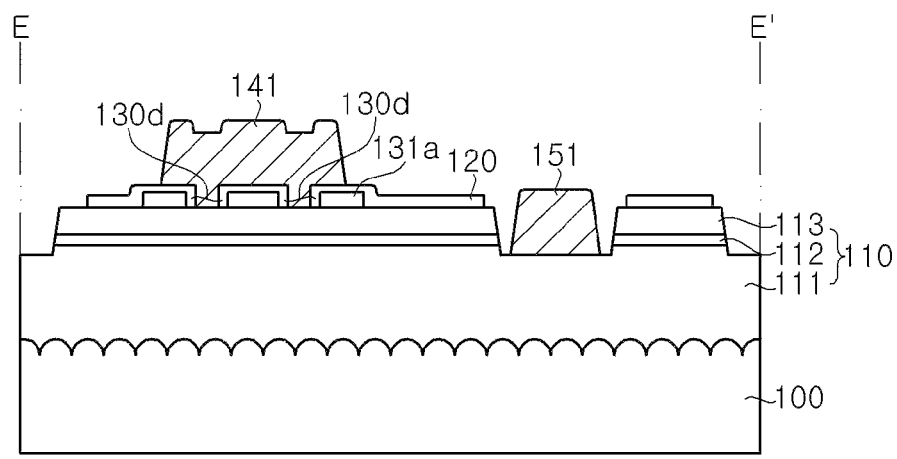
FIG. 12 is a cross-sectional view of the light emitting diode according to yet another exemplary embodiment of the present disclosure.

FIG. 9 to FIG. 12 are plan views and cross-sectional views of a light emitting diode according to yet another exemplary embodiment of the present disclosure. FIG. 9 is a plan view of the light emitting diode, FIG. 10 is an enlarged view of Part I3 of the light emitting diode of FIG. 9, FIG. 11 is a cross-sectional view taken along line D-D' of FIG. 9. FIG. 12 is a cross-sectional view taken along line E-E' of FIG. 9.

The light emitting diode of FIG. 1 is generally similar to the light emitting diode of FIG. 9. Specifically, the light emitting diode of FIG. 1 is the same as the light emitting diode of FIG. 9 in that both light emitting diodes include the connecting portion 131 and the protruding portion 132. However, in the light emitting diode of FIG. 1, the second bonding pad 141 is disposed on the mesas M between plural connecting portions 131 adjacent to each other, whereas the second bonding pad 141 is disposed on the connecting portion 131 in this exemplary embodiment. In addition, the connecting portion 131 includes a plurality of openings 130d, 130e. The following description will focus on different features resulting from these structures.

The plurality of mesas M may include a first mesa M1 and a second mesa M2 adjacent to each other. For example, as shown in FIG. 9 and FIG. 10, the first mesa M1 and the second mesa M2 may have a symmetrical shape with respect to an imaginary line extending between the first mesa M1 and the second mesa M2, without being limited thereto. Alternatively, the light emitting structure 110 may include three or more mesas M.

The connecting portion 131 may include a first connecting portion 131a disposed on the first mesa M1 and the second mesa M2.

The second electrode 140 includes the second bonding pad 141, which may be disposed on the first connecting portion 131a. The first connecting portion 131a may have a shape corresponding to an outer peripheral shape of the second bonding pad 141. For example, when the second bonding pad 141 has a circular shape, the connecting portion 131 may have a circular shape.

The connecting portion 131 may include a first opening 130d exposing an upper surface of the first mesa M1 and a second opening 130e exposing an upper surface of the second mesa M2. As shown in FIG. 11 and FIG. 12, the second bonding pad 141 may physically contact the second conductivity type semiconductor layer 113 through the first opening 130d and the second opening 130e. Each of the first opening 130d and the second opening 130e may include at least one concave portion K1 or K2. With the concave portion K1, the first opening 130d may have four steps along the outer periphery of the first opening 130d in a direction of line E-E', as shown in FIG. 12. On the other hand, in a structure wherein the first opening 130d and the second opening 130e do not include the concave portion K1, the second bonding pad 141 can contact the second conductivity type semiconductor layer 113 in one region of the first opening 130d in the direction of line E-E'. That is, the first opening 130d includes only two steps along the outer periphery thereof in the direction of line E-E'. Accordingly, the light emitting diode according to this exemplary embodiment has many steps under the second bonding pad 141, thereby preventing defects such as detachment of the second bonding pad 141.

The first electrode 150 may include a first bonding pad 151 and a lower extension portion 152. The first bonding pad 151 may be disposed between the first mesa M1 and the second mesa M2. The lower extension portion 152 may be disposed on the first exposed region R1. Furthermore, the lower extension portion 152 may be disposed between the first bonding pad 151 and the second bonding pad 141. This structure can prevent excessive current crowding in the first bonding pad 151 and allows efficient current supply to the regions of the mesas M between the first bonding pad 151 and the upper extension portion 142, thereby improving luminous intensity of these regions.

The first opening 130d and the second opening 130e may have a symmetrical structure with respect to an imaginary line intersecting the first bonding pad 151 and the second bonding pad 141. Accordingly, the second bonding pad 141 can maintain good reliability with respect to external impact applied in opposite directions. Furthermore, each of the concave portion K1 of the first opening 130d and the concave portion K2 of the second opening 130e may be parallel to the outer periphery of the first connecting portion 131a. For example, in a structure wherein the first connecting portion 131a has a circular shape as shown in FIG. 9 and FIG. 10, each of the concave portions K1, K2 of the first and second openings 130d, 130e may have an arc shape along the circular shape of the first or second opening. Generally, when a wire is bonded to the second bonding pad 141 by a solder, a central portion of an upper surface of the solder contacting the wire is convex in a circular shape due to bonding strength between the wire and the solder, and a central portion of an upper surface of the solder contacting the second bonding pad 141 is concave in a circular shape. In the structure wherein each of the concave portions K1, K2 of the first and second openings 130d, 130e has an arc shape along the circular shape of the first or second opening, a portion of the upper surface of the second bonding pad 141 corresponding to the region of the first connecting portion 131a between the concave portion K1 of the first opening 130d and the concave portion K2 of the second opening 130e may have a substantially circular shape. As such, since the morphology of the lower surface of the solder becomes similar to the morphology of the upper surface of the second bonding pad 141, bonding strength between the wire and the second bonding pad 141 can be strong, thereby improving reliability of the light emitting diode.

Furthermore, each of the first opening 130d and the second opening 130e may include at least one convex portion V1 or V2, which may be parallel to the outer periphery of the connecting portion 131. Accordingly, the second bonding pad 141 may include a depressed portion formed on the upper surface thereof and having a substantially circular shape. With this structure, the second bonding pad allows uniform distribution of the wire upon wire bonding, thereby preventing leakage of the solder out of the connecting portion 131.

A portion of the transparent electrode layer 120 disposed on the first exposed region R1 may have a larger area than a portion of the second electrode 140 disposed on the first exposed region R1. Specifically, a portion of the second region 122 disposed on the first exposed region R1 may have a larger area than a portion of the second bonding pad 141 disposed on the first exposed region R1. The second region 122 includes side surfaces (a) disposed on the first exposed region R1, and the second bonding pad 141 includes side surfaces (b) disposed on the first exposed region R1, in which the side surfaces (b) of the second bonding pad 141 may be disposed between the side surfaces (a) of the second region 122. More specifically, the portion of the second region 122 disposed on the first exposed region R1 does not cover the side surfaces (a) of the transparent electrode layer 120. In a structure wherein the second bonding pad 141 covers the side surfaces (a) of the second region 122 on the first exposed region R1, a portion of a corner of the upper surface of the second bonding pad 141 does not overlap the transparent electrode layer 120 in the vertical direction, thereby providing a depressed portion. In this structure, the solder can flow along the depressed portion to the first conductivity type semiconductor layer 111 upon wire bonding. Conversely, in the structure according to this exemplary embodiment, the depressed portion is not formed at the corner of the second bonding pad 141, thereby improving reliability of the light emitting diode.

In order to achieve the structure according to this exemplary embodiment, advantageously, the second bonding pad 141 is disposed on the first connecting portion 131a and the second region 122 is disposed on the protruding portion 132. In addition, considering the first opening 130d and the second opening 130e, such a structure has advantages. Specifically, in a structure wherein the current blocking layer 130 does not include the protruding portion 132, the area of the second bonding pad 141 must be reduced to prevent the second bonding pad 141 from covering the side surfaces (a) of the second region 122 on the first exposed region R1. At the same time, a minimum size of each of the first opening 130d and the second opening 130e must be maintained to maintain physical reliability of the second bonding pad 141. In this case, the second bonding pad 141 does not sufficiently fill the first opening 130d or the second opening 130e, causing detachment of the second bonding pad 141, thereby deteriorating physical reliability of the light emitting diode. Accordingly, the current blocking layer 130 includes the protruding portion 132 and the second region 122 is disposed on the protruding portion 132 in order to prevent such a problem.

The light emitting diode of FIG. 9 may not include the first section 142b1 disposed between the first bonding pad 151 and the second bonding pad 141. Unlike the light emitting diode of FIG. 1 in which the second bonding pad 141 is disposed only on one first mesa M1, the second bonding pad 141 of the light emitting diode shown in FIG. 9 is disposed on the first mesa M1, the second mesa M2, and the first exposed region R1 between the first mesa M1 and the second mesa M2. Accordingly, the light emitting diode can maintain current spreading effects and improvement in luminous intensity through the upper extension portion 142 instead of the first section 142b1.

Figure 13:
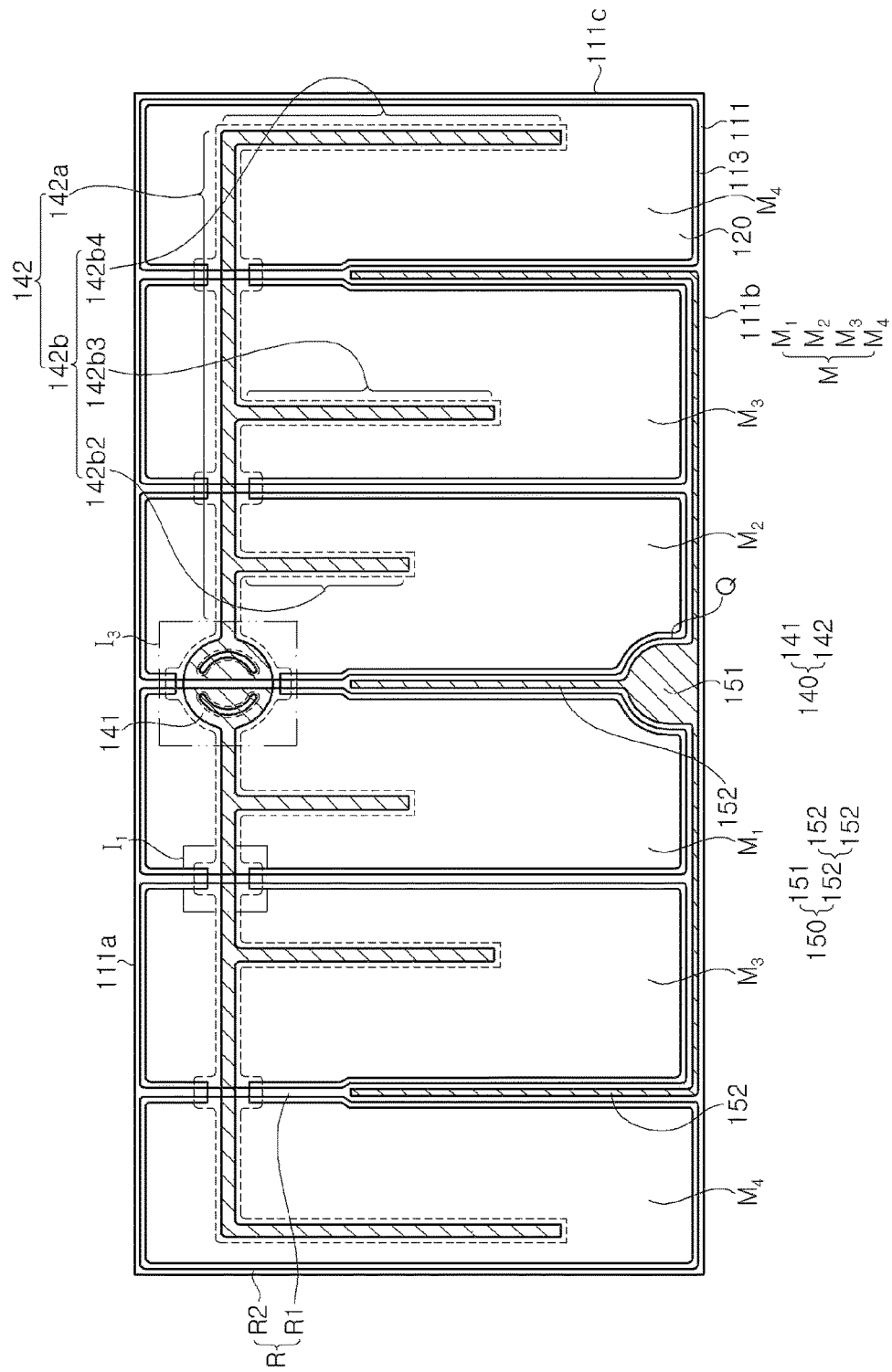
FIG. 13 is a plan view of a light emitting diode according to another exemplary embodiment of the present disclosure.

FIG. 13 is a plan view of a light emitting diode according to another exemplary embodiment of the present disclosure. The light emitting diode of FIG. 13 is similar to the light emitting diode described with reference to FIGS. 9 to 12. The light emitting diode of FIG. 13 also includes a part I₃, which is shown by an enlarged view of FIG. 10. However, the light emitting diode of FIG. 13 is different from the light emitting diode described with reference to FIG. 9 to FIG. 12 in terms of the mesas M and the upper extension portion 142b.

Specifically, the light emitting diode of FIG. 13 may include a plurality of mesas M like the light emitting diode of FIG. 9. The light emitting diode of FIG. 13 may further include a plurality of third mesas M3 and a plurality of fourth mesas M4. The plurality of third mesas M3 may be disposed adjacent to the first mesa M1 and the second mesa M2, respectively, such that the first mesa M1 and the second mesa M2 are disposed between the plural third mesas M3. Further, the plurality of fourth mesas M4 may be disposed adjacent to the third mesas M3 such that the third mesas M3 are disposed between the fourth mesas M4. Accordingly, the light emitting diode of FIG. 13 includes a larger number of connecting portions 131 than the light emitting diode of FIG.

9, and may further include third sections 142b3 disposed on the third mesas M3 and fourth sections 142b4 disposed on the fourth mesas M4.

The invention claimed is:
1. A light emitting diode, comprising:
a light emitting structure comprising a first conductivity type semiconductor layer and a plurality of mesas comprising a second conductivity type semiconductor layer disposed on the first conductivity type semiconductor layer and an active layer interposed between the first conductivity type semiconductor layer and the second conductivity type semiconductor layer, the first conductivity type semiconductor layer comprising an exposed region between the plurality of mesas;
a first electrode disposed on the first conductivity type semiconductor layer and electrically connected to the first conductivity type semiconductor layer;
a current blocking layer disposed on a portion of the plurality of mesas and a portion of the exposed region;
a transparent electrode layer disposed on a portion of the plurality of mesas and a portion of the exposed region, the transparent electrode layer partially covering the second conductivity type semiconductor layer and the current blocking layer; and
a second electrode disposed on the current blocking layer and the transparent electrode layer and electrically connected to the second conductivity type semiconductor layer,
wherein the current blocking layer comprises a connecting portion extending from a first mesa of the plurality of mesas to a second mesa of the plurality of mesas adjacent to the first mesa, and a protruding portion protruding from the connecting portion and disposed on the exposed region.
2. The light emitting diode according to claim 1, wherein the first conductivity type semiconductor layer comprises:
a first side surface adjacent to the connecting portion;
a second side surface opposite to the first side surface; and
third side surfaces disposed between the first side surface and the second side surface and intersecting each of the first side surface and the second side surface, and
the protruding portion protrudes towards the first side surface or the second side surface.
3. The light emitting diode according to claim 2, wherein:
the plurality of mesas comprises a plurality of second mesas and the first mesa interposed between the plurality of second mesas, the second mesa included in the plurality of second mesas,
the second electrode comprises a second bonding pad disposed on the first mesa and between the connecting portions adjacent to each other,
the first electrode comprises a first bonding pad disposed between the first mesa and the second side surface, and
the light emitting diode has a symmetrical structure with respect to an imaginary line intersecting the first bonding pad and the second bonding pad.
4. The light emitting diode according to claim 3, wherein:
the second electrode comprises an upper extension portion extending from the second bonding pad, and
the upper extension portion comprises a first upper extension portion disposed on the connecting portion and adjoining the second bonding pad, and a second upper extension portion parallel to the third side surfaces.
5. The light emitting diode according to claim 4, wherein a shortest distance between the first upper extension portion and the first side surface is less than a shortest distance between a central portion of the second bonding pad and the first side surface.
6. The light emitting diode according to claim 4, wherein a distance between a distal end of the second upper extension portion and the first side surface is greater than a distance between the distal end of the second upper extension portion and the second side surface.
7. The light emitting diode according to claim 6, wherein the second upper extension portion comprises a second section disposed on the second mesa and parallel to the third side surfaces.
8. The light emitting diode according to claim 7, wherein the second upper extension portion further comprises a first section disposed on the first mesa and between the first bonding pad and the second bonding pad while adjoining the second bonding pad, and the second section has a greater length than the first section.
9. The light emitting diode according to claim 8, wherein the second section has a greater width than the first section.
10. The light emitting diode according to claim 8, wherein a distal end of the second section is directed towards an imaginary line intersecting the first bonding pad and the second bonding pad.
11. The light emitting diode according to claim 7, wherein:
the plurality of mesas further comprise a plurality of third mesas each interposed between the second mesa and the third side surface;
the first mesa is disposed between the plurality of third mesas; and
the second upper extension portion further comprises a third section disposed on each third mesa and parallel to the third side surface.
12. The light emitting diode according to claim 11, wherein the third section has a greater length than the second section.
13. The light emitting diode according to claim 12, wherein the third section has a greater width than the second section.
14. The light emitting diode according to claim 13, wherein:
the protruding portion comprises a first protruding portion,
a distance between a distal end of the first protruding portion and the second side surface is smaller than a distance between the first protruding portion and the first side surface, and
each of the second sections is disposed on the first protruding portion.
15. The light emitting diode according to claim 11, wherein a portion of the second section is disposed on the first mesa and a region of the exposed region disposed between the first mesa and each second mesa.
16. The light emitting diode according to claim 4, wherein the first electrode comprises a lower extension portion connected to the first bonding pad, and a distance between a distal end of the lower extension portion and the second side surface is greater than a distance between the distal end of the lower extension portion and the first side surface.
17. The light emitting diode according to claim 16, wherein the lower extension portion comprises a first lower extension portion disposed on the exposed region.
18. The light emitting diode according to claim 17, wherein the lower extension portion comprises a second lower extension portion disposed between the first bonding pad and the second bonding pad.

19. The light emitting diode according to claim 3, wherein a portion of the second mesa is disposed between the first mesa and the first side surface.

20. The light emitting diode according to claim 1, wherein each mesa of the plurality of mesas is the same size.

21. A light emitting diode comprising:
a light emitting structure comprising a first conductivity type semiconductor layer, and a plurality of mesas comprising a second conductivity type semiconductor layer disposed on the first conductivity type semiconductor layer and an active layer interposed between the first conductivity type semiconductor layer and the second conductivity type semiconductor layer, the first conductivity type semiconductor layer comprising an exposed region between the plurality of mesas;
a first electrode disposed on the first conductivity type semiconductor layer and electrically connected to the first conductivity type semiconductor layer;
a current blocking layer disposed on a portion of the plurality of mesas and a portion of the exposed region;
a transparent electrode layer disposed on a portion of the plurality of mesas and a portion of the exposed region, the transparent electrode layer partially covering the second conductivity type semiconductor layer and the current blocking layer; and
a second electrode disposed on the current blocking layer and the transparent electrode layer and electrically connected to the second conductivity type semiconductor layer,
wherein the current blocking layer comprises a connecting portion extending from a first mesa of the plurality of mesas to a second mesa of the plurality of mesas adjacent to the first mesa;
the plurality of mesas comprises the first mesa and the second mesa disposed adjacent to each other;
the connecting portion comprises a first connecting portion disposed on the first mesa and the second mesa; and
the first connecting portion comprises a first opening exposing an upper surface of the first mesa and a second opening exposing an upper surface of the second mesa, each of the first opening and the second opening comprising at least one concave portion.

22. The light emitting diode according to claim 21, wherein:
the second electrode comprises a second bonding pad disposed on the first connecting portion,
the first electrode comprises a first bonding pad interposed between the first mesa and the second mesa, and
the first opening and the second opening have a symmetrical structure with respect to an imaginary line intersecting the first bonding pad and the second bonding pad.

23. The light emitting diode according to claim 22, wherein the first connecting portion has a circular shape, and each of the concave portions of the first and second openings is parallel to an outer periphery of the first connecting portion.

24. The light emitting diode according to claim 23, wherein each of the first opening and the second opening comprises at least one convex portion,
the convex portion being parallel to the outer periphery of the first connecting portion.

25. The light emitting diode according to claim 24, wherein the second bonding pad contacts the second conductivity type semiconductor layer through the first opening and the second opening.

26. The light emitting diode according to claim 25, wherein the second bonding pad has a circular shape.

27. A light emitting diode, comprising:
a light emitting structure comprising a first conductivity type semiconductor layer, and a plurality of mesas comprising a second conductivity type semiconductor layer disposed on the first conductivity type semiconductor layer and an active layer interposed between the first conductivity type semiconductor layer and the second conductivity type semiconductor layer, the first conductivity type semiconductor layer comprising an exposed region between the plurality of mesas;
a first electrode disposed on the first conductivity type semiconductor layer and electrically connected to the first conductivity type semiconductor layer;
a transparent electrode layer disposed on a portion of the plurality of mesas and a portion of the exposed region;
a current blocking layer interposed between the transparent electrode layer and the second conductivity type semiconductor layer and interposed between the transparent electrode layer and the exposed region; and
a second electrode disposed on the current blocking layer to partially cover the transparent electrode layer and electrically connected to the second conductivity type semiconductor layer,
wherein the transparent electrode layer comprises a plurality of first regions disposed on the plurality of mesas and a second region disposed on the exposed region and adjoining the plurality of first regions.

28. The light emitting diode according to claim 27, wherein portions of the transparent electrode layer disposed on the plurality of mesas are connected to each other.

29. The light emitting diode according to claim 28, wherein the current blocking layer comprises a connecting portion disposed between the second region and the exposed region.

30. The light emitting diode according to claim 29, wherein a portion of the connecting portion on the exposed region has a greater width than a portion of the second region disposed on the exposed region.

31. The light emitting diode according to claim 30, wherein a portion of the second region disposed on the exposed region has a greater width than a portion of the second electrode disposed on the exposed region.

32. The light emitting diode according to claim 27, wherein a side surface of a first region of the plurality of first regions is parallel to a side surface of a mesa of the plurality of mesas.

* * * * *